(12) United States Patent
Nakahara et al.

(10) Patent No.: US 12,218,638 B2
(45) Date of Patent: Feb. 4, 2025

(54) ELECTRONIC DEVICE AND ELECTROACOUSTIC CONVERSION APPARATUS

(71) Applicant: SONY SEMICONDUCTOR SOLUTIONS CORPORATION, Kanagawa (JP)

(72) Inventors: Hironori Nakahara, Kanagawa (JP); Daisuke Miyazaki, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 81 days.

(21) Appl. No.: 18/005,033

(22) PCT Filed: Jun. 22, 2021

(86) PCT No.: PCT/JP2021/023639
§ 371 (c)(1),
(2) Date: Jan. 10, 2023

(87) PCT Pub. No.: WO2022/019033
PCT Pub. Date: Jan. 27, 2022

(65) Prior Publication Data
US 2023/0253927 A1     Aug. 10, 2023

(30) Foreign Application Priority Data

Jul. 21, 2020   (JP) .................................. 2020-124512

(51) Int. Cl.
*H03K 7/08*     (2006.01)
*H03F 1/26*     (2006.01)
(Continued)

(52) U.S. Cl.
CPC ............. *H03F 1/26* (2013.01); *H03F 3/2178* (2013.01); *H04B 1/0475* (2013.01); *H04B 1/71637* (2013.01)

(58) Field of Classification Search
CPC ........ H03F 1/26; H03F 3/2178; H03F 3/2171; H03F 3/00; H04B 1/0475; H04B 1/71637; H04R 19/04
(Continued)

(56) References Cited

U.S. PATENT DOCUMENTS

| | | | |
|---|---|---|---|
| 2003/0042976 A1* | 3/2003 | Midya ................... | H03F 3/2171 330/10 |
| 2013/0236034 A1* | 9/2013 | Munenaga ............... | H03F 3/00 381/120 |
| 2019/0131961 A1* | 5/2019 | Fan ........................ | H04R 19/04 |

FOREIGN PATENT DOCUMENTS

| | | |
|---|---|---|
| JP | 2002-093997 A | 3/2002 |
| JP | 2005-136452 A | 5/2005 |

(Continued)

OTHER PUBLICATIONS

International Search Report and Written Opinion of PCT Application No. PCT/JP2021/023639, issued on Sep. 14, 2021, 08 pages of ISRWO.

*Primary Examiner* — Phuong Phu
(74) *Attorney, Agent, or Firm* — CHIP LAW GROUP

(57) ABSTRACT

There is provided an electronic device including a switching element unit that applies a voltage based on a direct-current power supply to one end of an electroacoustic converter in response to a first pulse signal and applies a voltage based on the direct-current power supply to another end of the electroacoustic converter in response to a second pulse signal, and a delay circuit that generates a delay based on a (Continued)

communication frequency in at least one of the first pulse signal and the second pulse signal.

14 Claims, 10 Drawing Sheets

(51) Int. Cl.
*H03F 3/217* (2006.01)
*H03K 9/08* (2006.01)
*H04B 1/04* (2006.01)
*H04B 1/7163* (2011.01)

(58) Field of Classification Search
USPC .................... 375/238, 239, 295, 316, 259
See application file for complete search history.

(56) References Cited

FOREIGN PATENT DOCUMENTS

| | | |
|---|---|---|
| JP | 2008-509575 A | 3/2008 |
| JP | 2013-187861 A | 9/2013 |

* cited by examiner

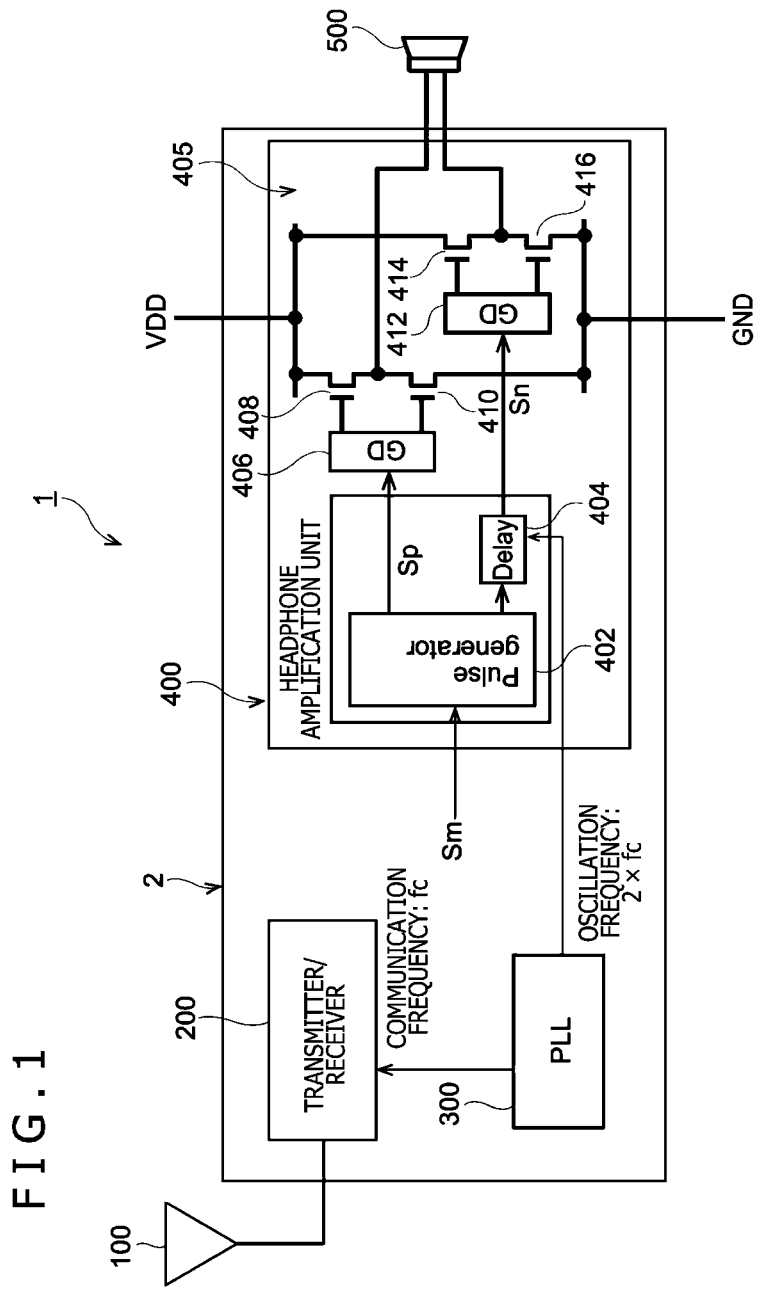
F I G . 1

FIG. 2A  Pos SIGNAL
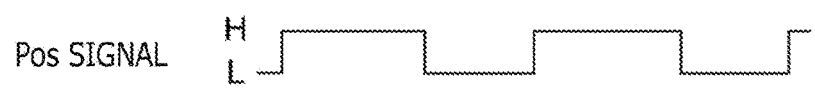
FIG. 2B  Neg SIGNAL
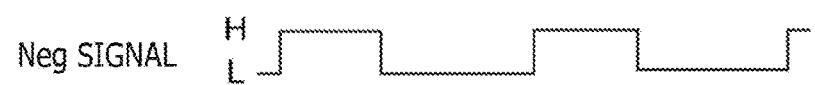
FIG. 2C  SPEAKER APPLICATION VOLTAGE
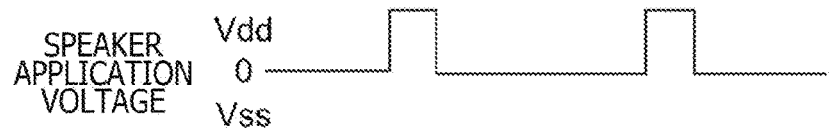
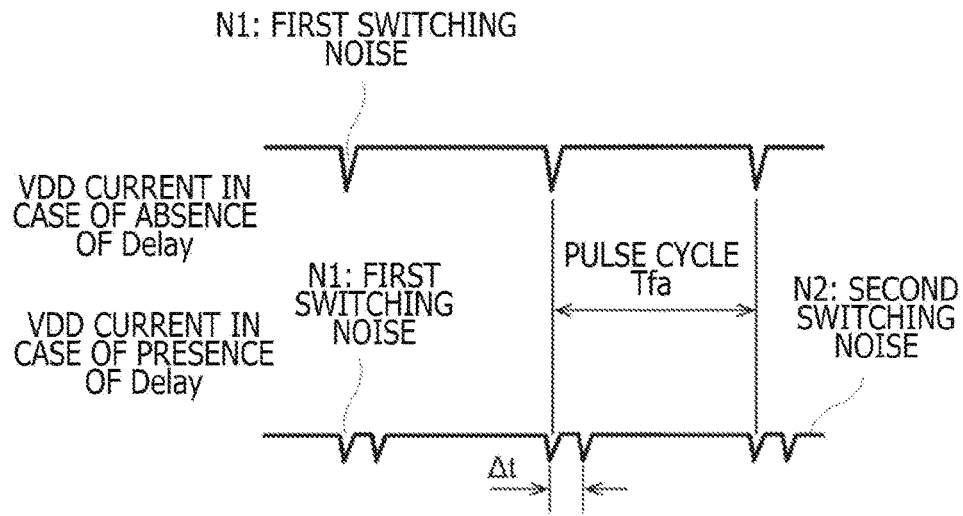
FIG. 3A  VDD CURRENT IN CASE OF ABSENCE OF Delay
FIG. 3B  VDD CURRENT IN CASE OF PRESENCE OF Delay FIG. 4A  NOISE IN CASE OF ABSENCE OF Delay
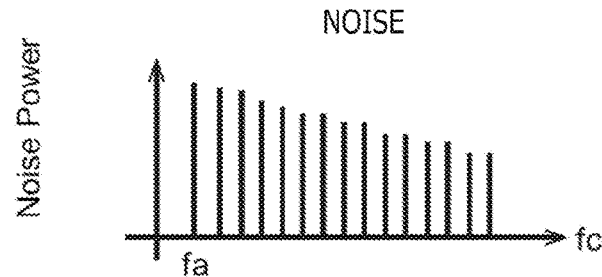
FIG. 4B  NOISE IN CASE OF PRESENCE OF Delay
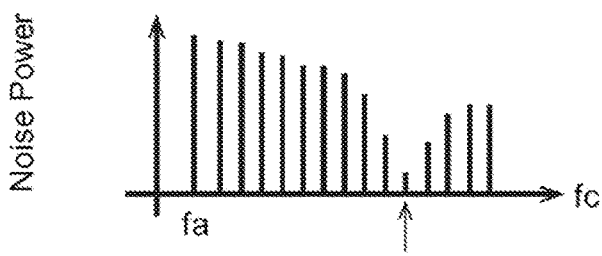

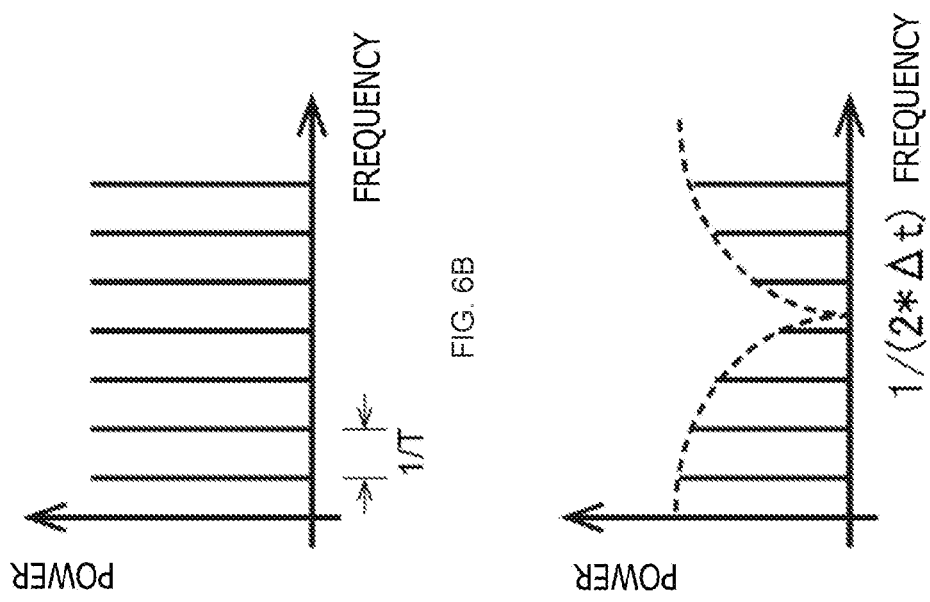

FIG. 9A  Spt1
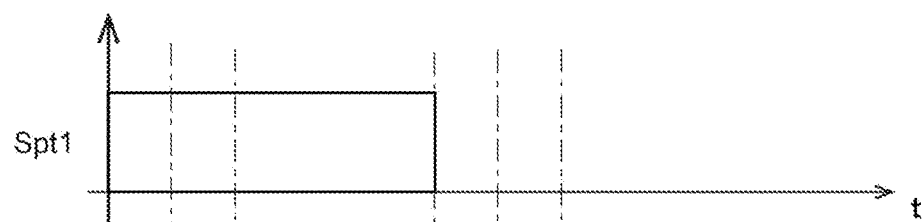
FIG. 9B  Spt2
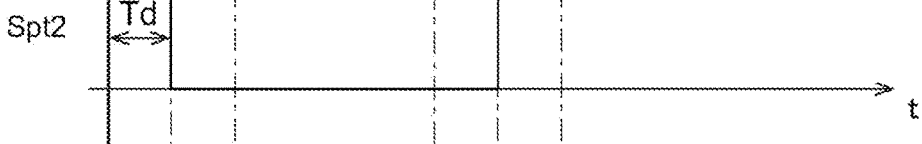
FIG. 9C  Spt3
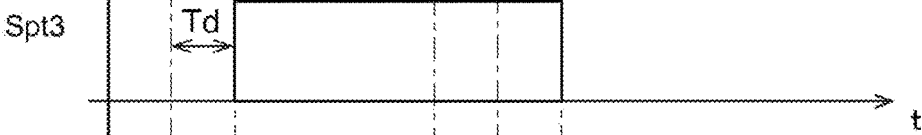
FIG. 9D  St4
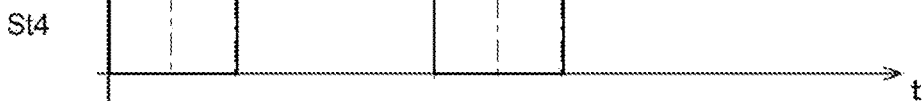

ELECTRONIC DEVICE AND ELECTROACOUSTIC CONVERSION APPARATUS

CROSS REFERENCE TO RELATED APPLICATIONS

This application is a U.S. National Phase of International Patent Application No. PCT/JP2021/023639 filed on Jun. 22, 2021, which claims priority benefit of Japanese Patent Application No. JP 2020-124512 filed in the Japan Patent Office on Jul. 21, 2020. Each of the above-referenced applications is hereby incorporated herein by reference in its entirety.

TECHNICAL FIELD

The present disclosure relates to an electronic device and an electroacoustic conversion apparatus.

BACKGROUND ART

An electronic device is used to amplify a feeble audio signal to drive an electroacoustic conversion element of a speaker, headphones, or the like. Further, a terminal such as a smartphone performs wireless communication and so forth while sound based on a sound signal is listened to on the terminal. However, there is the possibility that noise generated by electroacoustic conversion may disturb a communication frequency of transmission/reception signals.

CITATION LIST

Patent Literature

[PTL 1]
Japanese Patent Laid-Open No. 2002-93997

SUMMARY

Technical Problem

A mode of the present disclosure provides an electronic device and an electroacoustic conversion apparatus that can suppress noise.

Solution to Problem

In order to solve the problem described above, according to the present disclosure, there is provided an electronic device including a switching element unit that applies a voltage based on a direct-current power supply to one end of an electroacoustic converter in response to a first pulse signal and applies a voltage based on the direct-current power supply to another end of the electroacoustic converter in response to a second pulse signal, and a delay circuit that generates a delay based on a communication frequency in at least one of the first pulse signal and the second pulse signal.

The delay circuit may generate a delay time period based on a cycle of the communication frequency.

The delay time period may be one half of the cycle of the communication frequency.

The switching element unit may include first and second switching elements connected in series to the direct-current power supply and third and fourth switching elements connected in series to the direct-current power supply. The electroacoustic converter may be connected at the one end thereof to a connection point between the first and second switching elements and at the other end thereof to a connection point between the third and fourth switching elements.

The electronic device may further include a first gate controlling circuit that switches the first switching element on and off in response to the first pulse signal and switches the second switching element off when the first switching element is switched on but switches the second switching element on when the first switching element is switched off, and a third gate controlling circuit that switches the third switching element on and off in response to the second pulse signal and switches the fourth switching element off when the third switching element is switched on but switches the fourth switching element on when the third switching element is switched off.

The electronic device may further include a pulse generator that generates the first pulse signal and the second pulse signal, the first pulse signal may include a pulse signal having a duty ratio according to a level of a sound signal, and the second pulse signal may include another pulse signal having a duty ratio according to the level of the sound signal.

The electronic device may further include a pulse generator that generates a pulse signal according to a level of a sound signal, and the delay circuit may generate the first pulse signal delayed by a first delay time period based on a cycle of the communication frequency and the second pulse signal delayed by a second delay time period based on the cycle of the communication frequency.

The delay circuit may include a first flip-flop circuit having a D terminal to which the pulse signal is inputted, a clock terminal to which a clock signal based on the cycle of the communication frequency is inputted, and a Q terminal from which the first pulse signal is outputted, and a second flip-flop circuit having a D terminal to which the first pulse signal is inputted, a clock terminal to which the clock signal is inputted, and a Q terminal from which the second pulse signal is outputted.

The delay circuit may include a first delay circuit to which the pulse signal is inputted, a second delay circuit to which an output signal of the first delay circuit is inputted, an exclusive OR circuit to which the pulse signal and an output signal of the second delay circuit are inputted, an ethical product circuit to which an output signal of the exclusive OR circuit and a clock signal based on the cycle of the communication frequency are inputted, a first flip-flop circuit having a D terminal to which the output signal of the first delay circuit is inputted, a clock terminal to which an output signal of the ethical product circuit is inputted, and a Q terminal from which the first pulse signal is outputted, and a second flip-flop circuit having a D terminal to which the first pulse signal is inputted, a clock terminal to which the output signal of the ethical product circuit is inputted, and a Q terminal from which the second pulse signal is outputted.

The delay circuit may include a first delay circuit to which the pulse signal is inputted, a second delay circuit to which an output signal of the first delay circuit is inputted, an exclusive OR circuit to which the pulse signal and an output signal of the second delay circuit are inputted, an ethical product circuit to which an output signal of the exclusive OR circuit and a clock signal based on the cycle of the communication frequency are inputted, a first flip-flop circuit having a D terminal to which the output signal of the first delay circuit is inputted, a clock terminal to which an output signal of the ethical product circuit is inputted, and a Q terminal from which the first pulse signal is outputted, and a second flip-flop circuit having a D terminal to which the first pulse signal is inputted, a clock terminal to which the output signal of the ethical product circuit is inputted, and a Q terminal from which the second pulse signal is outputted.

The electronic device may further include a frequency synthesizer that generates a signal of a reference frequency according to the communication frequency, and the delay circuit may be driven on the basis of the signal of the reference frequency.

The reference frequency to be outputted from the frequency synthesizer may be switched according to a time zone.

The electronic device may further include a communication instrument that performs at least one of transmission and reception with the communication frequency based on the reference frequency.

In order to solve the problem described above, according to the present disclosure, there is provided an electronic device including a communication instrument that performs at least one of transmission and reception with the communication frequency, and a switching element unit that applies a voltage based on a direct-current power supply to an electroacoustic converter in response to two pulse signals based on a sound signal. At least one of the two pulse signals is delayed by a cycle based on the communication frequency.

An electroacoustic conversion apparatus including the electronic device described above and the electroacoustic converter may be provided.

BRIEF DESCRIPTION OF DRAWINGS

FIG. 1 is a diagram depicting an example of a configuration of an electroacoustic conversion apparatus according to an embodiment.

FIGS. 2A, 2B, and 2C are diagrams depicting a relation among one pulse signal, a second pulse signal, and a speaker application voltage.

FIGS. 3A and 3B are diagrams depicting an example of a power supply voltage current flowing between a power supply voltage and the ground.

FIGS. 4A and 4B are diagrams schematically depicting noise upon electroacoustic conversion arising from the power supply voltage current.

FIGS. 6A, 6B, 6C, and 6D are diagrams illustrating reduction of a noise component in FIGS. 4A and 4B.

FIGS. 9A, 9B, 9C, and 9D are diagrams depicting an example of an output signal of an ethical product circuit when a first pulse signal is outputted.

DESCRIPTION OF EMBODIMENTS

Figure 5B:
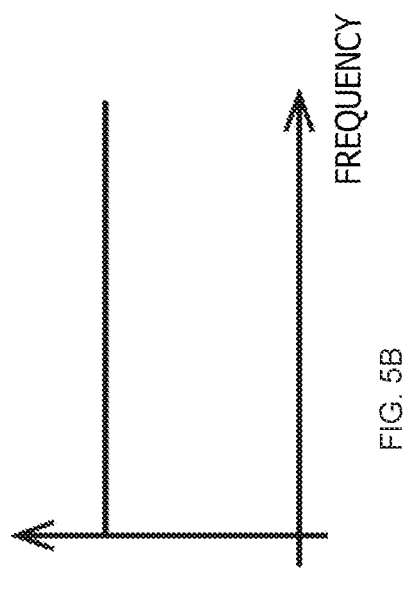
FIGS. 5A, 5B, 5C, and 5D are diagrams illustrating reduction of high frequency noise.

In the following, embodiments of an electronic device and an electroacoustic conversion apparatus are described with reference to the drawings. While the following description is given focusing on major component parts of an electronic device and an electroacoustic conversion apparatus, the electronic device and the electroacoustic conversion apparatus possibly include component parts and functions that are not illustrated or described. The following description does not exclude such component parts and functions that are not illustrated or described.

First Embodiment

A configuration of an electronic device according to the present embodiment is described with reference to FIG. 1. FIG. 1 is a diagram depicting an example of a configuration of an electroacoustic conversion apparatus 1 according to the present embodiment. The electroacoustic conversion apparatus 1 is an apparatus capable not only of performing wireless communication but also of performing acoustic conversion of a sound signal Sm. The electroacoustic conversion apparatus 1 includes an electronic device 2, an antenna 100, and a headphone 500. The electronic device 2 includes a communication instrument 200, a frequency synthesizer 300, and a headphone amplification unit 400.

The antenna 100 receives a reception signal of a radio frequency and transmits a transmission signal of a radio frequency.

The communication instrument 200 is, for example, a BT receiver and first amplifies a signal corresponding to a communication frequency fc, for example, in a band of 2.4 Ghz, received by the antenna 100 and then converts the amplified signal into a digital signal. The BT receiver is compatible with BLE specialized for power saving applications of Bluetooth (registered trademark). It is to be noted that, while the communication instrument 200 in the present embodiment is, for example, a BT receiver, this is not restrictive. For example, the communication instrument 200 may otherwise be a GNSS transmitter/receiver.

The frequency synthesizer 300 is a phase locked loop (PLL) circuit that performs loop control of the communication frequency fc of the communication instrument 200. The frequency synthesizer 300 generates a reference frequency signal of, for example, a frequency 2×fc corresponding to twice the communication frequency fc and supplies a frequency signal of the frequency fc to the communication instrument 200.

The frequency synthesizer 300 generates a reference frequency signal on the basis of, for example, a frequency band signal of transmission/reception signals. For example, the frequency band signal complies with Bluetooth. For example, frequencies from 2.402 to 2.480 [GHz] are divided into 79. In short, communication is performed using the frequency of any one of 2.402 [GHz], 2.403 [GHz], 2.404 [GHz], . . . , and 2.480 [GHz]. The communication instrument 200 switches (performs hopping of) the frequency band to be used by the frequency synthesizer 300 after every period of time.

The headphone amplification unit 400 is, for example, a filterless class-D amplifier. The headphone amplification unit 400 includes a pulse generator 402, a delay circuit 404, and a switching element unit 405. The switching element unit 405 includes a first gate controlling circuit 406, first switching elements 408 and 410, a second gate controlling circuit 412, and second switching elements 414 and 416.

In the filterless class-D amplifier, the switching elements 408, 410, 414, and 416 that are connected to each other in full bridge connection are on-off switched with a pulse signal (PWM signal) of a predetermined frequency whose pulse width is modulated according to a signal level of an input audio signal Sm. This drives the headphone 500 (electroacoustic converter) connected as a load to the full bridge circuit in full bridge connection.

The pulse generator 402 generates a first pulse signal (Sp signal) and a second pulse signal (Sn signal) according to the sound signal Sm. For example, the first pulse signal is a pulse signal having a duty ratio according to the level of the audio signal Sm, and the second pulse signal is another pulse signal having a duty ratio according to the level of the sound signal Sm. Various methods are available for a generation method of the first pulse signal and the second pulse signal, and a known method can be used.

The delay circuit 404 relatively delays one of the first pulse signal and the second pulse signal by $\Delta t$ on the basis of the communication frequency fc. For example, the delay circuit 404 delays the second pulse signal by a ½ cycle of the communication frequency fc ($\Delta t=\frac{1}{2}$ fc) with respect to the first pulse signal. While the delay circuit 404 according to the present embodiment delays the second pulse signal, this is not restrictive. For example, the first pulse signal may be delayed alternatively. Details of the delay circuit 404 are hereinafter described.

As described hereinabove, the signal based on the communication frequency fc is supplied from the frequency synthesizer 300. Therefore, for example, also in a case where the frequency band used by the frequency synthesizer 300 is switched (hopped) after every period of time, it is possible to cause the second pulse signal to be delayed on the basis of the communication frequency fc.

FIGS. 2A, 2B, and 2C are diagrams depicting a relation among the first pulse signal generated by the pulse generator 402, the second pulse signal generated by the pulse generator 402, and a speaker application voltage. Here, an example of signals free from a delay is depicted. FIG. 2A depicts the first pulse signal, FIG. 2B depicts the second pulse signal, and FIG. 2C depicts the speaker application voltage. The axis of abscissa indicates time. FIGS. 2A, 2B, and 2C depict a state, for example, when the input signal has a positive polarity and has a medium level.

As depicted in FIGS. 2A, 2B, and 2C, the duty ratio of the first pulse signal generated by the pulse generator 402 is higher than 50%, and the duty ratio of the second pulse signal generated by the pulse generator 402 is lower than 50%. Accordingly, to the headphone 500, for example, a pulse voltage of a positive polarity according to the positive polarity level of the input signal is applied as depicted in (c) of FIG. 2C.

Referring back to FIG. 1, the switching element unit 405 applies a voltage based on a direct-current power supply VDD to one end of the headphone 500 in response to the first pulse signal and applies another voltage based on the direct-current power supply VDD to another end of the headphone 500 in response to the second pulse signal. In particular, between the direct-current power supply VDD and the ground GND, a series connection circuit of the first switching elements 408 and 410 and another series connection circuit of the second switching elements 414 and 416 are each connected. The headphone 500 is connected to a midpoint between the first switching elements 408 and 410 and a midpoint between the second switching elements 414 and 416. In this manner, the first switching elements 408 and 410 and the second switching elements 414 and 416 configure a full bridge circuit, and the headphone 500 is connected to the midpoint between the first switching elements 408 and 410 and the midpoint between the second switching elements 414 and 416.

The first gate controlling circuit 406 switches the first switching elements 408 and 410 on and off in opposite directions to each other in response to the first pulse signal. In particular, when the first switching element 408 is on, the first switching element 410 is driven to off, but when the first switching element 408 is off, the first switching element 410 is driven to on.

The second gate controlling circuit 412 switches the second switching elements 414 and 416 on and off in opposite directions to each other in response to the second pulse signal. In particular, when the second switching element 414 is on, the second switching element 416 is driven to off, but when the second switching element 414 is off, the second switching element 416 is driven to on.

Here, details of an example of control of the delay circuit 404 are described with reference to FIGS. 3A and 3B.

FIGS. 3A and 3B are diagrams depicting an example of a power supply voltage VDD current that flows between the power supply voltage VDD and the ground (GND). FIG. 3A is a diagram depicting an example of the power supply voltage VDD current in a case where a delay process by the delay circuit 404 is not performed. FIG. 3B is a diagram depicting an example of the power supply voltage VDD current in a case where a delay process by the delay circuit 404 is performed.

As depicted in FIG. 3A, in a case where a delay process by the delay circuit 404 is not performed, first switching noise N1 of a pulse cycle Tfa by the headphone amplification unit 400 is generated in the power supply voltage VDD current. Consequently, in the headphone 500, noise arising from the first switching noise N1 is generated upon electroacoustic conversion. It is to be noted that, in the description of the present embodiment, noise generated upon electroacoustic conversion is referred to as electroacoustic conversion noise.

On the other hand, in a case where a delay process of $\Delta t=\frac{1}{2}fc$ by the delay circuit 404 is performed for the second pulse signal, in addition to the first switching noise N1 of the pulse cycle Tfa, second switching noise N2 of the pulse cycle Tfa delayed by $\Delta t$ from the first switching noise N1 is added to the power supply voltage VDD current.

FIGS. 4A and 4B are diagrams schematically depicting noise upon electroacoustic conversion arising from the power supply voltage VDD current. The axis of ordinate indicates power of the noise, and the axis of abscissa indicates frequency. FIG. 4A corresponds to a case in which a delay process by the delay circuit 404 is not performed. FIG. 4B corresponds to a case in which a delay process by the delay circuit 404 is performed. As depicted in FIG. 4B, a noise component of the frequency $f=1/(2\times\Delta t)$ is reduced.

Figure 5D:
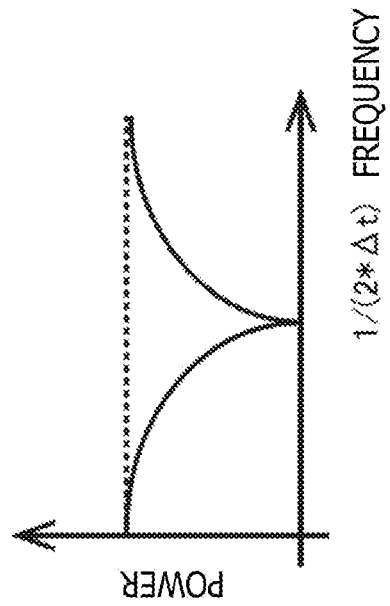
Figure 5A:
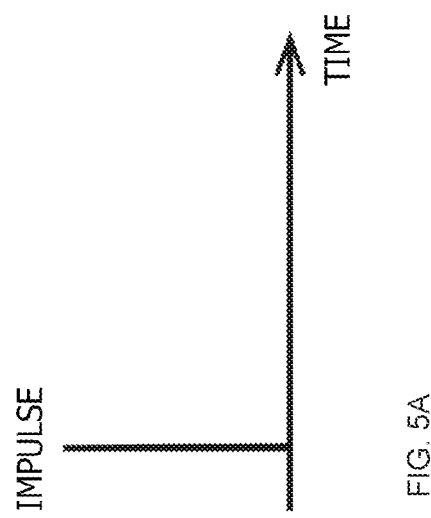

FIGS. 5A, 5B, 50, and 5D are diagrams illustrating reduction of high frequency noise. FIG. 5A depicts impulse noise. The axis of ordinate indicates strength of noise, and the axis of abscissa indicates time. FIG. 5B is a diagram depicting the impulse noise of FIG. 5A in frequency. The axis of ordinate indicates power, and the axis of abscissa indicates frequency.

Figure 5C:
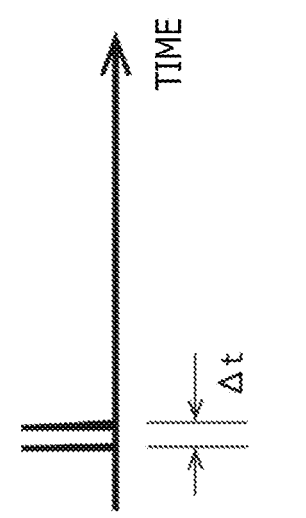

FIG. 5C depicts impulse noise having an interval $\Delta t$. The axis of ordinate indicates strength of noise, and the axis of abscissa indicates time. FIG. 5D is a diagram depicting the impulse noise of FIG. 5C in frequency. The axis of ordinate indicates power, and the axis of abscissa indicates frequency. As depicted in FIG. 5D, a noise component of the frequency $f=1/(2\times\Delta t)$ is reduced in comparison with that in (b) of FIG. 5B. In this case, if a magnitude of the impulse noise of FIG. 5C is 0.5 times that of the impulse noise of FIG. 5A, a total energy of the noise power depicted in FIG. 5D is twice the square of 0.5 of the total energy of the noise power indicated in FIG. 5B. In other words, the total energy of the noise power indicated in FIG. 5D is ½ times the total energy of the noise power depicted in FIG. 5B.

FIGS. 6A, 6B, 6C, and 6D are diagrams illustrating reduction of the noise component in FIGS. 4A and 4B. FIG. 6A depicts impulse noise having a cycle T (1/fc). The axis of ordinate indicates strength of noise, and the axis of abscissa indicates time. FIG. 6B is a diagram indicating the impulse noise of FIG. 6A in frequency. The axis of ordinate indicates power, and the axis of abscissa indicates frequency.

FIG. 6C depicts impulse noise of the communication frequency fc and impulse noise delayed by Δt from the impulse noise of the communication frequency fc. The axis of ordinate indicates power, and the axis of abscissa indicates frequency. FIG. 6D is a diagram indicating the impulse noise of FIG. 6C in frequency. The axis of ordinate indicates power, and the axis of abscissa indicated frequency. As depicted in of FIG. 6D, a noise component of the frequency f=1/(2×Δt) is reduced.

As depicted in FIGS. 3A and 3B, if the first pulse signal is applied to the first gate controlling circuit 406 and the second pulse signal is applied to the second gate controlling circuit 412 both without any delay, then switching noise arising from the first pulse signal and switching noise arising from the second pulse signal are generated at the same time and become the first switching noise N1.

On the other hand, for example, if the second pulse signal is delayed by Δt, then the second switching noise N2 arising from the second pulse signal is also delayed by Δt. In this case, since generation timings of the switching noise are shifted from each other, the magnitude of the noise pulse decreases to one half. Referring to FIGS. 6A, 6B, 6C, and 6D again, if it is assumed that the total energy of the first switching noise N1 depicted in FIG. 6B is 1, then the total energy of the noise power depicted in FIG. 6D becomes twice the square of 0.5. In other words, the total energy of the noise power depicted in FIG. 6D becomes ½ times the total energy of the noise power depicted in FIG. 6B.

As can be recognized from this, if Δt by the delay circuit 404 is set in such a manner that fc=1/(2×Δt) is satisfied, then the power of electroacoustic conversion noise arising from impulse noise of the communication frequency fc in the communication instrument 200 can be reduced to one half. In such a manner, if a relative delay of Δt=2×fc is generated on the second pulse signal with respect to the first pulse signal by the delay circuit 404, then noise to be generated upon electroacoustic conversion arising from current noise of the communication frequency fc applied to the power supply voltage VDD current is suppressed.

As described above, according to the present embodiment, by relatively delaying one of the first pulse signal and the second pulse signal by the delay circuit 404, electroacoustic noise arising from impulse noise of the communication frequency fc applied to the power supply voltage VDD current is suppressed. Especially, by delaying the signal with the cycle Δt set to 1/(2×fc), electroacoustic noise arising from and to be applied to the power supply voltage VDD current is suppressed more efficiently. Consequently, deterioration of the sound quality of the headphone 500 that is influenced by noise applied to the power supply voltage VDD current can be suppressed.

Second Embodiment

An electroacoustic conversion apparatus 1 according to the second embodiment is different from the electroacoustic conversion apparatus 1 according to the first embodiment in that the second pulse signal is generated by delaying the first pulse signal generated by a pulse generator 416, with use of D-type flip-flops connected to each other in cascade connection. In the following, the difference from the electroacoustic conversion apparatus 1 according to the first embodiment is described.

Figure 7A:
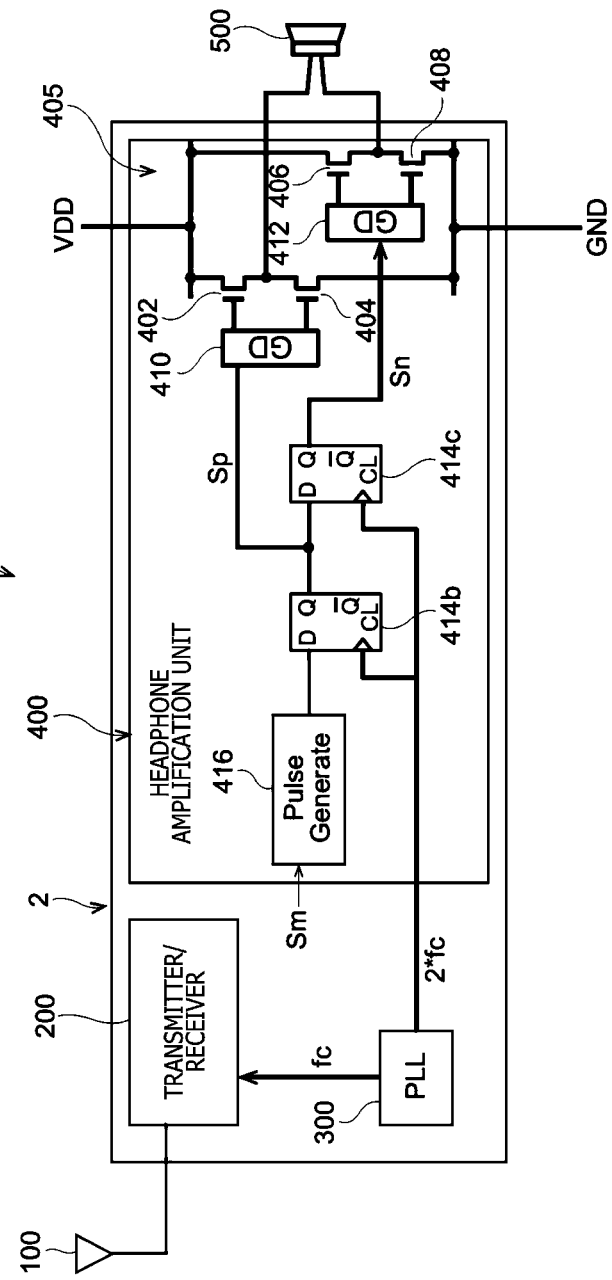
FIG. 7A is a diagram depicting an example of a configuration of an electroacoustic conversion apparatus according to a second embodiment.
Figure 7B:
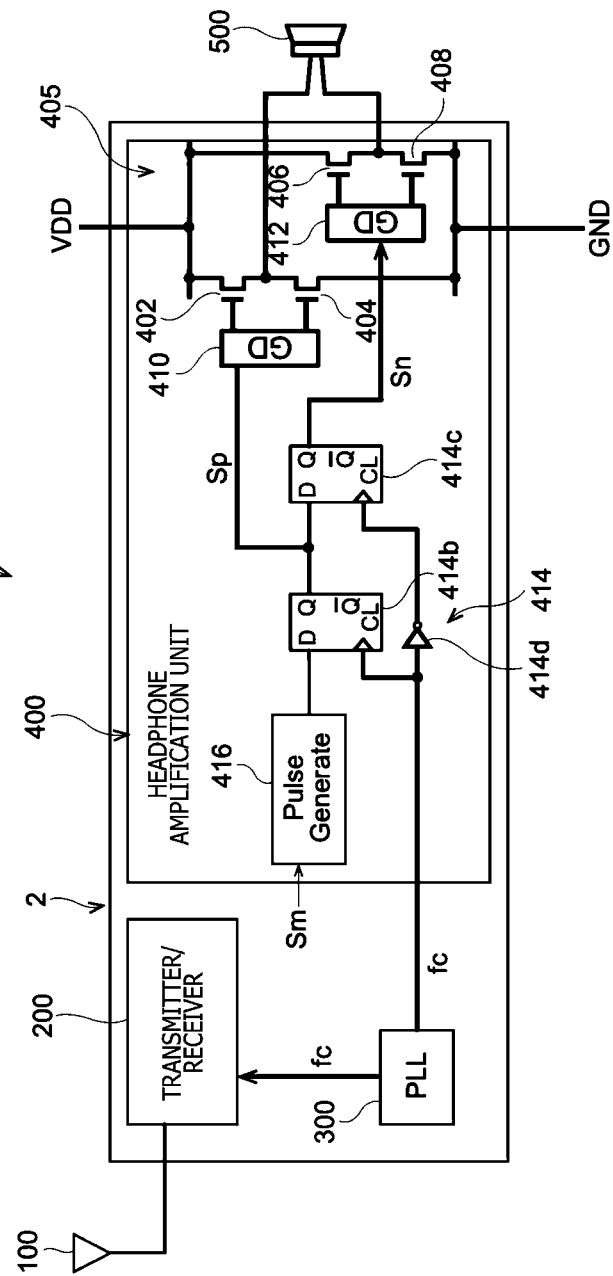
FIG. 7B is a diagram depicting another example of the configuration of the electroacoustic conversion apparatus according to the second embodiment.

FIG. 7A is a diagram depicting an example of a configuration of the electroacoustic conversion apparatus 1 according to the second embodiment. As depicted in FIGS. 7A and 7B, a frequency signal of the communication frequency 2×fc is supplied to D-type flip-flops 414b and 414c.

The first pulse signal is inputted to a D terminal of the D-type flip-flop 414b, and a clock signal of the frequency 2×fc is supplied to a CL terminal of the D-type flip-flop 414b. The D-type flip-flop 414c is connected in cascade connection to the D-type flip-flop 414b. In particular, a Q terminal of the D-type flip-flop 414b and a D terminal of the D-type flip-flop 414c are connected to each other, and the clock signal of the frequency 2×fc is supplied to a CL terminal of the D-type flip-flop 414c.

In such D-type flip-flops connected to each other in cascade connection as described above, if the first pulse signal is applied to the D terminal of the D-type flip-flop 414b, then the first D-type flip-flop 414b reads a D signal at a rising edge of the CLK signal, and the second D-type flip-flop 414c takes in a resulting first pulse signal Sp at a rising edge of the CLK signal. Consequently, resulting two pulse signals Sn are generated as signals delayed by one clock from the first pulse signal Sp. The second pulse signal Sn delayed by one clock with respect to the first pulse signal Sp is outputted in this manner. In particular, the second pulse signal Sn delayed by one cycle of the frequency (2×fc) with respect to the first pulse signal Sp is outputted from a Q terminal of the flip-flop 414c.

FIG. 7B is a diagram depicting another example of the configuration of the electroacoustic conversion apparatus 1 according to the second embodiment. As depicted in FIG. 7B, a frequency signal of the communication frequency fc is supplied to the D-type flip-flop 414b. Meanwhile, a frequency signal delayed by a half cycle of the communication frequency fc by a delay element 414d is supplied to the flip-flop 414c. Consequently, the second pulse signal Sn delayed by one clock with respect to the first pulse signal Sp is outputted. In particular, the second pulse signal Sn delayed by one cycle of the frequency (2×fc) with respect to the first pulse signal Sp is outputted from the Q terminal of the flip-flop 414c.

As described above, according to the present embodiment, one of the first pulse signal and the second pulse signal is relatively delayed by a cycle based on the communication frequency fc, with use of the D-type flip-flops 414b and 414c connected to each other. Consequently, electroacoustic noise arising from impulse noise of the communication frequency fc to be applied to the power supply voltage VDD current is suppressed.

Modifications of Second Embodiment

An electroacoustic conversion apparatus 1 according to a modification of the second embodiment is different from the electroacoustic conversion apparatus 1 according to the second embodiment in that an operating period of time of each of the D-type flip-flops 414b and 414c is shortened. In the following, the difference from the electroacoustic conversion apparatus 1 according to the second embodiment is described.

Figure 8A:
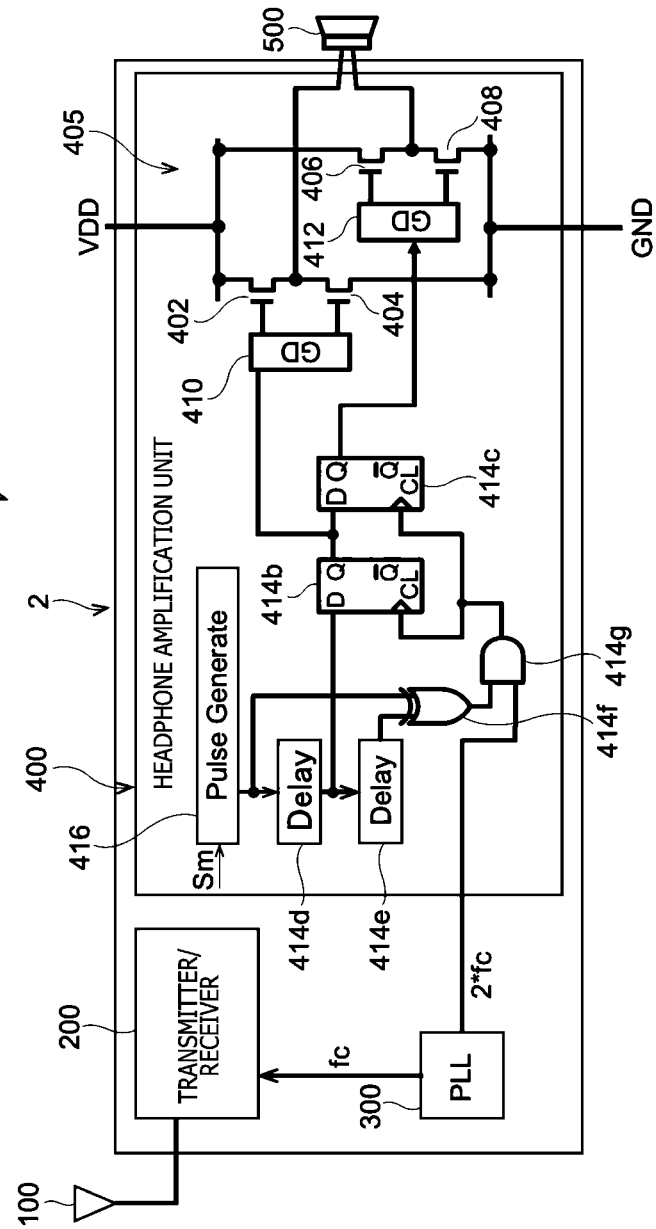
FIG. 8A is a diagram depicting an example of a configuration of an electroacoustic conversion apparatus according to a modification of the second embodiment.

FIG. 8A is a diagram depicting an example of a configuration of the electroacoustic conversion apparatus 1 according to the modification of the second embodiment. As depicted in FIG. 8A, the electroacoustic conversion apparatus 1 further includes delay circuits 414d and 414e, an exclusive OR circuit 414f, and an ethical product circuit 414g.

Figure 8B:
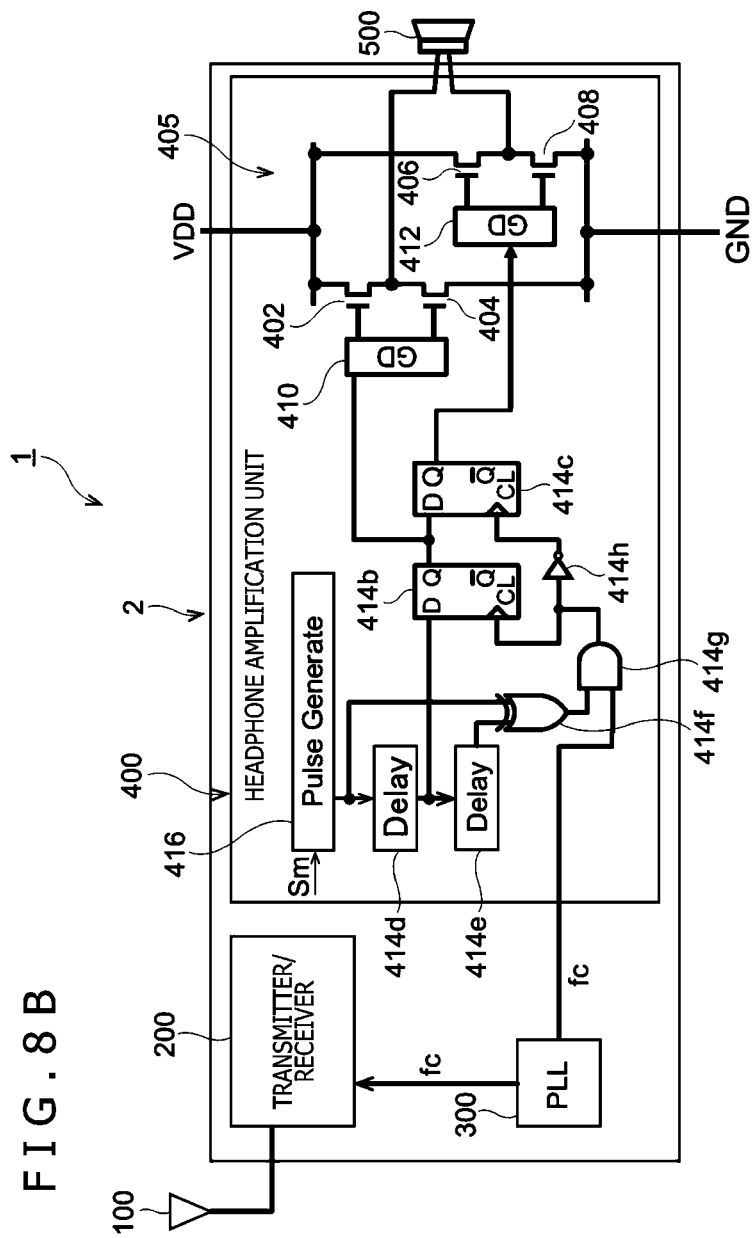
FIG. 8B is a diagram depicting another example of the configuration of the electroacoustic conversion apparatus according to the modification of the second embodiment.

FIG. 8B is a diagram depicting another example of the configuration of the electroacoustic conversion apparatus 1 according to the modification of the second embodiment. As depicted in FIG. 8B, the electroacoustic conversion apparatus 1 may further include, in addition to the configuration of the electroacoustic conversion apparatus 1 depicted in FIG. 7B, delay circuits 414d and 414e, an exclusive OR circuit 414f, and an ethical product circuit 414g.

One end of the delay circuit 414d is connected to an output terminal of the pulse generator 416, and another end of the delay circuit 414d is connected to an input terminal of the delay circuit 414e and the D terminal of the D-type flip-flop 414b. One end of the delay circuit 414e is connected to an output terminal of the delay circuit 414d, and another end of the delay circuit 414e is connected to an input terminal of the exclusive OR circuit 414f.

To input terminals of the exclusive OR circuit 414f, an output terminal of the delay circuit 414e and an output terminal of the pulse generator 402 are connected. Meanwhile, to an output terminal of the exclusive OR circuit 414f, an input terminal of the ethical product circuit 414g is connected.

To input terminals of the ethical product circuit 414g, the output terminal of the exclusive OR circuit 414f and the output terminal of the pulse generator 416 are connected. Meanwhile, an output terminal of the ethical product circuit 414g is connected to the CL terminals of the D-type flip-flops 414b and 414c.

FIGS. 9A, 9B, 9C, and 9D are diagrams depicting an example of an output signal St4 of the ethical product circuit 414g when a first pulse signal Spt1 is outputted from the pulse generator 402. The axis of ordinate indicates magnitude of the signal, and the axis of abscissa indicates time t. FIG. 9A depicts the first pulse signal Spt1 generated by the pulse generator 402, and FIG. 9B depicts a first pulse signal Spt2 delayed by a delay time period Td from the first pulse signal Spt1 by the delay circuit 414d.

FIG. 9C depicts a first pulse signal Spt3 further delayed by the delay time period Td from the first pulse signal Spt2 with use of the delay circuit 414d. FIG. 9D depicts an output signal of the ethical product circuit 414g. As depicted in FIGS. 8A and 8B, the first pulse signal Spt1 is outputted, after elapse of the delay time period Td, as the first pulse signal Spt2 to the input terminal of the delay circuit 414d and the D terminal of the D-type flip-flop 414b.

The delay circuit 414d outputs, after elapse of the delay time period Td, the third pulse signal Spt3 to the input terminal of the ethical product circuit 414g. Then, the exclusive OR circuit 414f outputs an exclusive OR of the first pulse signal Spt1 and the third pulse signal Spt3 as the output signal St4. In particular, the exclusive OR circuit 414f outputs the output signal St4 that is a high level signal during each of periods Td before and after each of reference points of time given by a rising edge and a falling edge of the first pulse signal Spt2 that is an input signal to the D terminal of the D-type flip-flop 414b.

Consequently, the ethical product circuit 414g supplies a clock signal, which indicates a high level during a period during which a high level period of the output signal St4 and a high level period of the clock signal of the frequency fc2/2 overlap each other, to the CL terminals of the D-type flip-flops 414b and 414c.

In this manner, in the electroacoustic conversion apparatus 1 according to the modification of the second embodiment, the pulse generator 402 supplies a clock signal having a fixed time period Td from each of a rising edge and a falling edge of the first pulse signal Spt2, which is based on an output, to the CL terminals of the D-type flip-flops 414b and 414c. Consequently, operation of the D-type flip-flops 414b and 414c is restricted to the fixed time period Td from each of the rising edge and the falling edge of the first pulse signal Spt2, and power consumption of the D-type flip-flops 414b and 414c can further be reduced.

It is to be noted that the present technology can adopt such configurations as described below.

(1) An electronic device including:
a switching element unit that applies a voltage based on a direct-current power supply to one end of an electroacoustic converter in response to a first pulse signal and applies a voltage based on the direct-current power supply to another end of the electroacoustic converter in response to a second pulse signal; and
a delay circuit that generates a delay based on a communication frequency in at least one of the first pulse signal and the second pulse signal.

(2) The electronic device according to claim 1, in which the delay circuit generates a delay time period based on a cycle of the communication frequency.

(3) The electronic device according to claim 2, in which the delay time period is one half of the cycle of the communication frequency.

(4) The electronic device according to any one of claims 1 to 3, in which
the switching element unit includes
first and second switching elements connected in series to the direct-current power supply, and
third and fourth switching elements connected in series to the direct-current power supply, and
the electroacoustic converter is connected at the one end thereof to a connection point between the first and second switching elements and at the other end thereof to a connection point between the third and fourth switching elements.

(5) The electronic device according to claim 4, further including:
a first gate controlling circuit that switches the first switching element on and off in response to the first pulse signal and switches the second switching element off when the first switching element is switched on but switches the second switching element on when the first switching element is switched off; and
a third gate controlling circuit that switches the third switching element on and off in response to the second pulse signal and switches the fourth switching element off when the third switching element is switched on but switches the fourth switching element on when the third switching element is switched off.

(6) The electronic device according to any one of claims 1 to 5, further including:
a pulse generator that generates the first pulse signal and the second pulse signal, in which
the first pulse signal includes a pulse signal having a duty ratio according to a level of a sound signal, and
the second pulse signal includes another pulse signal having a duty ratio according to the level of the sound signal.

(7) The electronic device according to any one of claims 1 to 5, further including:
a pulse generator that generates a pulse signal according to a level of a sound signal, in which
the delay circuit generates the first pulse signal delayed by a first delay time period based on a cycle of the communication frequency and the second pulse signal delayed by a second delay time period based on the cycle of the communication frequency.

(8) The electronic device according to claim 7, in which the delay circuit includes
a first flip-flop circuit having a D terminal to which the pulse signal is inputted, a clock terminal to which a clock signal based on the cycle of the communication frequency is inputted, and a Q terminal from which the first pulse signal is outputted, and
a second flip-flop circuit having a D terminal to which the first pulse signal is inputted, a clock terminal to which the clock signal is inputted, and a Q terminal from which the second pulse signal is outputted.

(9) The electronic device according to claim 7, in which the delay circuit includes
a first delay circuit to which the pulse signal is inputted,
a second delay circuit to which an output signal of the first delay circuit is inputted,
an exclusive OR circuit to which the pulse signal and an output signal of the second delay circuit are inputted,
an ethical product circuit to which an output signal of the exclusive OR circuit and a clock signal based on the cycle of the communication frequency are inputted,
a first flip-flop circuit having a D terminal to which the output signal of the first delay circuit is inputted, a clock terminal to which an output signal of the ethical product circuit is inputted, and a Q terminal from which the first pulse signal is outputted, and
a second flip-flop circuit having a D terminal to which the first pulse signal is inputted, a clock terminal to which the output signal of the ethical product circuit is inputted, and a Q terminal from which the second pulse signal is outputted.

(10) The electronic device according to any one of claims 1 to 9, further including:
a frequency synthesizer that generates a signal of a reference frequency according to the communication frequency, in which
the delay circuit is driven on the basis of the signal of the reference frequency.

(11) The electronic device according to claim 10, in which the reference frequency to be outputted from the frequency synthesizer is switched according to a time zone.

(12) The electronic device according to claim 10 or 11, further including:
a communication instrument that performs at least one of transmission and reception with the communication frequency based on the reference frequency.

(13) An electronic device including:
a communication instrument that performs at least one of transmission and reception with the communication frequency; and
a switching element unit that applies a voltage based on a direct-current power supply to an electroacoustic converter in response to two pulse signals based on a sound signal, in which
at least one of the two pulse signals is delayed by a cycle based on the communication frequency.

(14) An electroacoustic conversion apparatus including:
the electronic device according to any one of claims 1 to 13; and
the electroacoustic converter.

The mode of the present disclosure is not limited to the individual embodiments described hereinabove and also includes various modifications that can be conceived of by those skilled in the art. Also, advantageous effects of the present disclosure are not restricted to the contents described hereinabove. In other words, various additions, alterations, and partial deletions can be made without departing from the conceptual thoughts and intentions of the present disclosure derived from the contents defined in the claims and equivalents to them.

REFERENCE SIGNS LIST

1: Electroacoustic conversion apparatus
2: Electronic device
200: Communication instrument
300: Frequency synthesizer
402: Pulse generator
404: Delay circuit
405: Switching element unit
406: First gate controlling circuit
408, 410: First switching element
412: Second gate controlling circuit
414, 416: Second switching element
414b: D-type flip-flop
414c: D-type flip-flop
414d: Delay circuit
414e: Delay circuit
414f: Exclusive OR circuit
414g: Ethical product circuit
500: Headphone

The invention claimed is:
1. An electronic device, comprising:
a plurality of switching elements configured to:
apply, from a direct-current power supply, a voltage to a first end of an electroacoustic converter based on a first pulse signal, and
apply, from the direct-current power supply, the voltage to a second end of the electroacoustic converter based on a second pulse signal, wherein the electronic device is configured to perform wireless communication based on a communication frequency; and
a delay circuit configured to generate a delay, based on the communication frequency, in at least one of the first pulse signal or the second pulse signal.

2. The electronic device according to claim 1, wherein the delay circuit is further configured to generate a delay time period based on a cycle of the communication frequency.

3. The electronic device according to claim 2, wherein the delay time period is one half of the cycle of the communication frequency.

4. The electronic device according to claim 1, wherein the plurality of switching elements includes:
a first switching element and a second switching element connected in series to the direct-current power supply, and
a third switching element and a fourth switching element connected in series to the direct-current power supply;
the first end of the electroacoustic converter is connected to a first connection point between the first switching element and the second switching element; and the second end of the electroacoustic converter is connected to a second connection point between the third switching element and the fourth switching element.

5. The electronic device according to claim 4, further comprising:
a first gate controlling circuit configured to alternately switch on and off the first switching element and the second switching element based on the first pulse signal; and
a second gate controlling circuit configured to alternately switch on and off the third switching element and the fourth switching element based on the second pulse signal.

6. The electronic device according to claim 1, further comprising:
a pulse generator configured to generate the first pulse signal and the second pulse signal, wherein
the first pulse signal has a first duty ratio based on a level of a sound signal, and
the second pulse signal has a second duty ratio based on the level of the sound signal.

7. The electronic device according to claim 1, further comprising:
a pulse generator configured to generate a specific pulse signal based on a level of a sound signal, wherein
the delay circuit is further configured:
delay the specific pulse signal, by a first delay time period, to generate the first pulse signal, wherein the first delay time period is based on a cycle of the communication frequency, and
delay the specific pulse signal, by a second delay time period, to generate the second pulse signal, wherein the second delay time period is based on the cycle of the communication frequency.

8. The electronic device according to claim 7, wherein the delay circuit includes:
a first flip-flop circuit that includes:
a first D terminal configured to receive the specific pulse signal,
a first clock terminal configured to receive a clock signal based on the cycle of the communication frequency, and
a first Q terminal configured to output the first pulse signal; and
a second flip-flop circuit that includes:
a second D terminal configured to receive the first pulse signal,
a second clock terminal configured to receive the clock signal, and
a second Q terminal configured to output the second pulse signal.

9. The electronic device according to claim 7, wherein the delay circuit includes:
a first delay circuit configured to receive the specific pulse signal;
a second delay circuit configured to receive a first output signal from the first delay circuit;
an exclusive OR circuit configured to receive the specific pulse signal and a second output signal from the second delay circuit;
an ethical product circuit configured to receive a third output signal from the exclusive OR circuit and a clock signal, wherein the clock signal is based on the cycle of the communication frequency;
a first flip-flop circuit that includes:
a first D terminal configured to receive the first output signal,
a first clock terminal configured to receive a fourth output signal from the ethical product circuit, and
a first Q terminal configured to output the first pulse signal; and
a second flip-flop circuit that includes:
a second D terminal configured to receive the first pulse signal,
a second clock terminal configured to receive the fourth output signal, and
a second Q terminal configured to output the second pulse signal.

10. The electronic device according to claim 1, further comprising:
a frequency synthesizer configured to generate a signal of a reference frequency based on the communication frequency, wherein
the delay circuit is driven based on the signal of the reference frequency.

11. The electronic device according to claim 10, wherein the frequency synthesizer is further configured to:
switch the reference frequency based on a time zone; and
output the switched reference frequency.

12. The electronic device according to claim 10, further comprising:
a communication instrument configured to perform at least one of transmission or reception based on the reference frequency.

13. An electronic device, comprising:
a communication instrument configured to perform at least one of transmission or reception based on a communication frequency;
a plurality of switching elements configured to apply, from a direct-current power supply, a voltage to an electroacoustic converter based on a first pulse signal and a second pulse signal, wherein the first pulse signal and the second pulse signal are based on a sound signal; and
a delay circuit configured to delay at least one of the first pulse signal or the second pulse signal based on a cycle of the communication frequency.

14. An electroacoustic conversion apparatus, comprising:
an electroacoustic converter that includes a first end and a second end; and
an electronic device configured to perform wireless communication based on a communication frequency, wherein the electronic device includes:
a plurality of switching elements configured to:
apply, from a direct-current power supply, a voltage to the first end of the electroacoustic converter based on a first pulse signal, and
apply, from the direct-current power supply, the voltage to the second end of the electroacoustic converter based on a second pulse signal; and
a delay circuit configured to generate a delay, based on the communication frequency, in at least one of the first pulse signal or the second pulse signal.

* * * * *